United States Patent [19]

Bukhman

[11] Patent Number: 4,523,976
[45] Date of Patent: Jun. 18, 1985

[54] METHOD FOR FORMING SEMICONDUCTOR DEVICES

[75] Inventor: Yefim Bukhman, Tempe, Ariz.

[73] Assignee: Motorola, Inc., Schaumburg, Ill.

[21] Appl. No.: 627,264

[22] Filed: Jul. 2, 1984

[51] Int. Cl.³ .................. B44C 1/22; C03C 15/00; C03C 25/06; B29C 17/08

[52] U.S. Cl. .................. 156/643; 156/646; 156/652; 156/655; 156/659.1; 156/668; 156/644; 204/192 E; 427/38; 427/88; 430/317

[58] Field of Search ............... 156/643, 646, 652, 655, 156/659.1, 653, 668, 657, 661.1, 644; 204/164, 192 E; 252/79.1; 430/317; 427/38, 39, 40, 41, 43.1, 88

[56] References Cited

U.S. PATENT DOCUMENTS

| 4,372,034 | 2/1983 | Bohr | 29/578 X |
| 4,487,652 | 12/1984 | Almgren | 156/668 X |

FOREIGN PATENT DOCUMENTS 53-13372  2/1978  Japan ......................... 156/652

Primary Examiner—William A. Powell
Attorney, Agent, or Firm—John A. Fisher

[57] ABSTRACT

A method is disclosed for forming openings in polyimide layers and for thereby forming semiconductor devices. The method allows for the forming of openings having tapered side walls and precise dimensional control. First and second layers of polyimide are sequentially formed on a surface. The first layer, in contact with the surface, is fully cured while the second layer is only partially cured. Overlying the second layer is a masking layer which can alternatively be an inorganic material or a resist material. A pattern is formed in the masking layer to expose portions of the upper polyimide layer. The pattern includes openings of predetermined size having a precise critical dimension. Using the patterned masking layer as an etch mask the upper layer of polyimide is isotropically etched in an etchent which etches the partially cured polyimide but which does not etch the fully cured underlying polyimide. The underlying polyimide layer is then anisotropically etched using the patterned masking layer as an etch mask to form openings in the cured polyimide layer having the same critical dimensions as in the masking layer pattern. The masking layer is then removed and the second polyimide layer is fully cured.

11 Claims, 14 Drawing Figures

METHOD FOR FORMING SEMICONDUCTOR DEVICES

BACKGROUND OF THE INVENTION

This invention relates generally to the etching of openings in polyimide layers, and more specifically to the etching through a polyimide layer of openings having sloped side walls and a carefully controlled size and to the application of such etching to the fabrication of semiconductor devices.

In the fabrication of semiconductor devices of high density and high complexity, it is necessary to shrink the size and spacing of device features. It is also necessary or desirable to use thick layers of insulating material to isolate between the semiconductor substrate and an overlying metal layer or between multiple metal layers. It is further desirable that this thick insulating layer also act to planarize the surface upon which a subsequent metal layer is to be applied. Polyimide layers in which a liquid material is applied to the surface of the semiconductor substrate and subsequently heat treated to cure or form the polyimide material are well suited to the function of forming a planarizing and insulating layer. The use of thick polyimide insulating layers, however, especially on small geometry devices, presents a problem with metal continuity into contact openings. To provide the desired electrical contact between layers, contact openings must be formed through the polyimide material. Metal is then applied over the surface of the device and into these contact openings. Because the polyimide may be thick, however, it is difficult to achieve reliable metal coverage on the peripheral walls of the contact opening to the underlying material. Metal step coverage problems are enhanced by the need for the metal patterns to consist of narrow metal stripes which, in turn, require these stripes to be thin to allow fine geometry patterning. To ensure reliable step coverage into openings through the thick polyimide layer, it is imperative that the edges of the opening be tapered. It is also important, however, that the size of the opening be carefully controlled. The latter requirement stems partly from the fact that the device region being contacted may also be small. If the size is not controlled and the opening through the polyimide material is too large, then the subsequently applied metal may cause shorting between adjacent device regions. There are a number of processes which provide for either the tapering of the walls of the opening or for the control of critical dimensions, but there has not been a production compatible etching process which simultaneously achieved both of these necessary features.

It is therefore an object of this invention to provide a process for etching an opening through a polyimide layer wherein the opening has tapered side walls and a controlled size.

It is another object of the invention to provide an improved process for fabricating a semiconductor device including the etching of contact openings through thick polyimide layers.

BRIEF SUMMARY OF THE INVENTION

The foregoing and other objects and advantages of the invention are achieved through a process which uses the differential etching of partially and fully cured polyimide material. In one embodiment of the invention a first fully cured polyimide layer and a second partially cured polyimide layer are applied overlying the surface of a semiconductor substrate. A masking layer is then applied to the partially cured polyimide layer and patterned in a pattern which it is desired to replicate in the polyimide layer adjacent the underlying substrate. The partially cured polyimide layer is isotropically etched using the patterned masking layer as an etch mask. The etchant used for the isotropic etching is selective and stops at the surface of the cured polyimide material. The cured polyimide material is then anisotropically etched using the patterned masking layer as an etch mask to replicate the mask pattern in the cured polyimide material. The etch mask is then removed and the partially cured polyimide material is fully cured to leave a layer of polyimide material having sloped side walls in an upper portion and a precisely dimensioned opening at the underlying semiconductor surface.

DETAILED DESCRIPTION OF PREFERRED EMBODIMENTS

Figure 1:
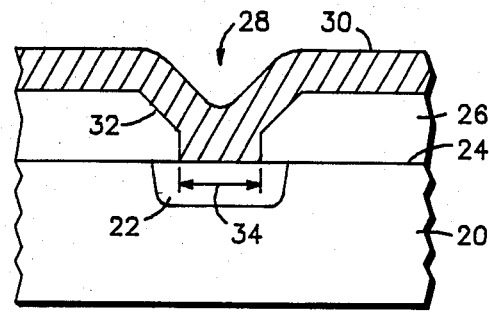
FIG. 1 illustrates a portion of a semiconductor device fabricated in accordance with the invention.

FIG. 1 depicts a portion of a semiconductor device and illustrates a desired result achievable by practice of the process in accordance with the invention. The device depicted includes a semiconductor substrate 20 which has a device region 22 thereon or therein. The device region may be diffused, ion implanted, deposited, or the like, and forms a portion of a transistor, diode, or other semiconductor element or a contact thereto. Overlying the surface 24 of semiconductor substrate 20 is a thick layer 26 of polyimide material. In various other embodiments there may be other layers of different materials such as oxides, nitrides, metals, polycrystalline semiconductor, and the like interposed between semiconductor material 20 and polyimide material 26 such that the polyimide is not disposed directly on surface 24. An opening 28 through the polyimide material allows selective contact to device region 22 by metallization 30. In the context of this invention, the terms "metallization" and "metal" are used to mean a metal such as aluminum or other conductor material such as doped polycrystalline silicon. In accordance with the invention, opening 28 is characterized by sloped side walls 32 which ensure that good step coverage is achieved as metal 30 passes down into opening 28 to contact region 22. The bottom portion of opening 28 is further characterized by a precisely determined critical dimension as indicated by a double headed arrow 34. In a complex and high density integrated circuit, for example, both opening 28 and device region 22 will be of minimal size. Maintaining the predetermined critical size of the opening 28 ensures that the minimal opening is aligned with the region 22 and does not overlap the edge of the region allowing metal 30 to electrically short between region 22 and substrate 20 or another device region (not shown).

Figure 2:
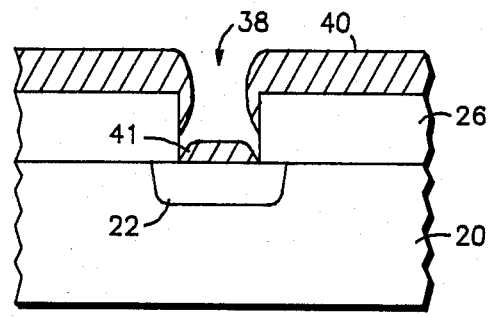
FIG. 2 illustrates a portion of a semiconductor device illustrating problems overcome by the present invention.

In contrast, FIG. 2 depicts a portion of a semiconductor device illustrating problems attendant with prior art structures wherein openings through a thick insulator had substantially vertical, not sloped, peripheral walls. The device illustrated includes a semiconductor substrate 20 and device region 22 overlaid by a thick layer 26 of polyimide material. Opening 38 through the thick polyimide material is characterized by substantially vertical side walls. Because of the nearly vertical side walls, difficulty is encountered in traversing these walls with metallization 40. Cusping of the metal as it traverses the nearly vertical walls and attendant discontinuity are typical so that the contact between metallization 40 and the metal 41 found at the bottom of opening 38 is at best unreliable and may even be discontinuous.

Figure 3:
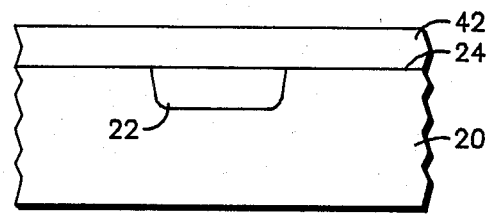
FIGS. 3-9 illustrate process steps in accordance with one embodiment of the invention.
Figure 4:
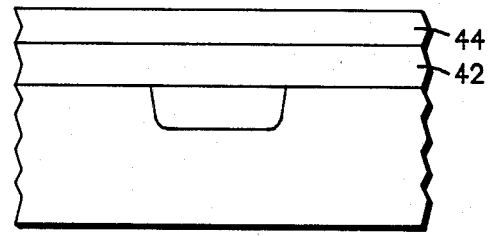

FIGS. 3–9 illustrate process steps in accordance with one embodiment of the invention whereby a device structure as illustrated in FIG. 1 is achieved. FIGS. 3–9 depict a portion of a semiconductor device such as an integrated circuit. In an integrated circuit there are, of course, a very large number of such portions. FIG. 3 depicts a semiconductor substrate 20 in or on which a device region 22 has been formed. Overlying surface 24 of semiconductor substrate 20 is a fully cured layer of polyimide material 42. Polyimide material is applied to the substrate as a liquid and is then cured in a heat treatment step as more fully discussed herein below.

Over the layer of fully cured polyimide material 42 is applied a second layer of polyimide 44, but this second layer is only partially cured. The degree of curing, as used herein, is a function of the time and temperature to which the polyimide material is subjected. The degree of curing affects the etch characteristics of the polyimide material, with fully cured polyimide substantially insoluble in materials in which the partially cured polyimide is readily soluble.

Figure 5:
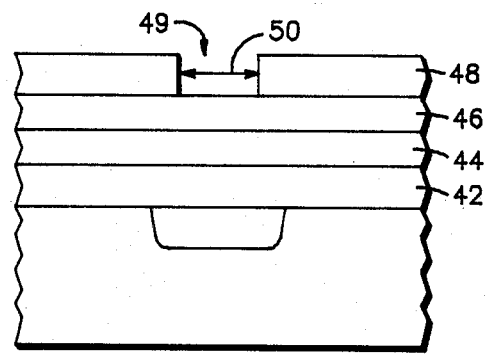

As illustrated in FIG. 5, a masking layer 46 is formed overlying polyimide layers 42 and 44. In this embodiment masking layer 46 comprises a layer of inorganic material such as plasma deposited silicon dioxide, plasma deposited silicon nitride, or the like. A patterned layer of resist 48 is formed overlying the masking layer. Resist layer 48 can be a photoresist, electron beam resist, X-ray resist, or the like. Resist layer 48 is patterned by the patterned exposure to actinic radiation and subsequent development. As illustrated, resist layer 48 is patterned to form an opening 49 having a predetermined critical dimension as indicated by the double headed arrow 50.

Figure 6:
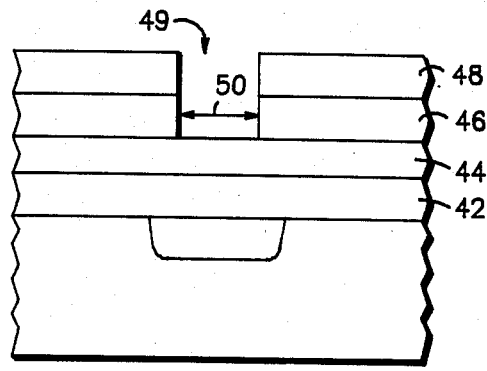
Figure 7:
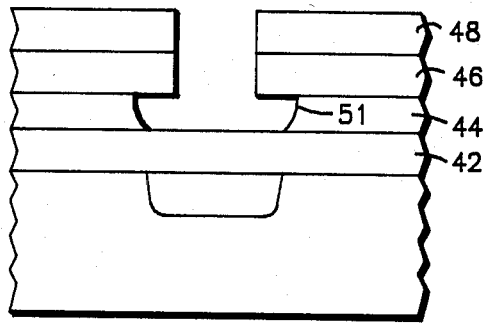

Resist layer 48 is used as an etch mask to anisotropically etch layer 46 to replicate the opening 49 in the masking layer. Anisotropic etching, such as reactive ion etching, replicates the resist pattern without undercutting the resist. Critical dimension 50 is thus maintained in the opening etched through masking layer 46 as illustrated in FIG. 6.

Partially cured polyimide layer 44 is then isotropically etched using the patterned masking layer 46 as an etch mask. The polyimide layer can be etched isotropically, for example, in an aqueous isopropanol solution of tetramethylammonium hydroxide or in AZ1350J developer supplied by the A. Z. Hoechst Corporation. These etchants are isotropic and etch at a substantially equal rate in all directions. As the etching proceeds downwardly, therefore, the etching also proceeds laterally underneath masking layer 46. Fully cured polyimide layer 42 is insoluble in these etchants, causing the isotropic etching to terminate at the interface between the cured and partially cured materials. The resultant edge profile, by the nature of the isotropic etching, provides a tapered edge 50 with the opening having a width greater than the width of the original opening through resist layer 48 and masking layer 46. The isotropic etching is difficult to control precisely, with the result that the critical dimension control is not easily maintained in layer 44 at the intersection between layers 44 and 42. The amount of slope at edge 50 depends upon the amount of partial curing which layer 44 has undergone and upon the type of etchant used.

Figure 8:
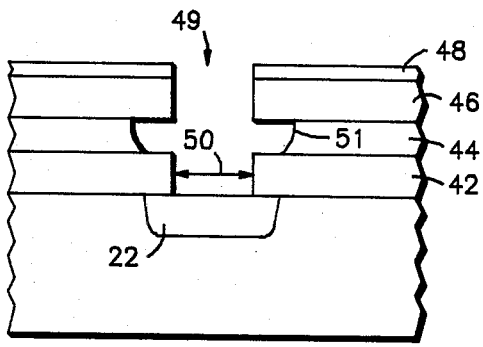

As illustrated in FIG. 8, completely cured polyimide layer 42 is anisotropically etched using the patterned resist 48 and masking layer 46 as an etch mask. The anisotropic etching can be done, for example, by reactive ion etching. The reactive ion etch allows the exact transfer of the critical dimension 50 from the resist layer and masking layer through the cured polyimide layer 42. One method to anisotropically etch the cured polyimide layer is by reactive ion etching using an oxygen based chemistry. This etching also attacks resist layer 48 and will thin or remove layer 48 during the etching of layer 42, depending upon the exact relative thicknesses of the two layers. The inorganic masking layer 46, however, is unaffected by the oxygen based reactive ion etch and thus remains as an etch mask throughout the etching process. After the completion of the etch through layer 42, opening 49 extends through the composite overlying structure to expose a portion of the surface of device region 22.

Figure 9:
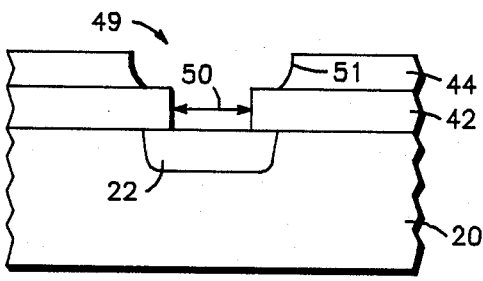

In the event that resist layer 48 has not been completely removed during the anisotropic etching of layer 42, the resist layer is now removed, for example, in a photoresist stripping solution. Masking layer 46 is next removed either in a wet etch or in a dry plasma etch. The method of removal of masking layer 47 depends upon the material which constitutes the masking layer as well as the materials underlying the masking layer. For example, if the masking layer is silicon dioxide and the material exposed at the bottom of opening 49 is either silicon or aluminum, the masking layer can be removed by wet etching in a solution of water and hydrofluoric acid or in a fluorine based plasma which is selective to polyimide and either silicon or aluminum. After the removal of masking layer 46 the structure appears as illustrated in FIG. 9 and includes a completely cured polyimide layer 42, a partially cured polyimide layer 44, and an opening 49 through the two layers and exposing a portion of the surface of device region 22. The opening is characterized by sloped side walls 51 and a predetermined critical dimension 50 at the intersection of the polyimide with the surface of substrate 20. The structure of FIG. 1 is then achieved by heating the structure to effect the complete cure of layer 44. Metallization is then applied and patterned over the polyimide passivated structure.

Figure 10:
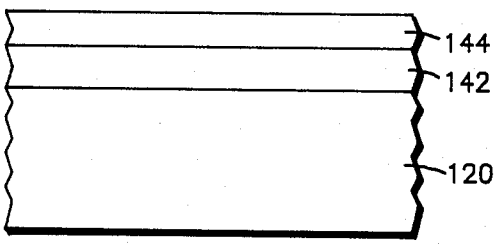
FIGS. 10-14 illustrate process steps in accordance with a further embodiment of the invention.

FIGS. 10–14 illustrate a further embodiment of a process in accordance with the invention by which the device structure illustrated in FIG. 1 can be achieved. As in the previously described embodiment, the process starts with a semiconductor substrate 20 which may include device regions or the like and which may be covered by one or more insulator layers, metal layers and the like. Overlying substrate 120, as illustrated in FIG. 10, is a first fully cured polyimide layer 142 and a second partially cured polyimide layer 144.

Figure 11:
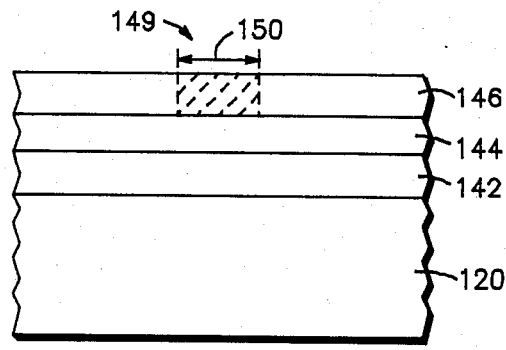

A masking layer 146 is formed overlying partially cured polyimide layer 144 as illustrated in FIG. 11. In this embodiment, masking layer 146 is a layer of positive photoresist. The photoresist is exposed by actinic radiation and a latent image 149 is formed in the exposed area. The dimensions of the latent image correspond to the critical dimension 150 which it is desired to replicate at the bottom of polyimide layer 142 adjacent the underlying substrate. In this embodiment the thickness of layer 146 should be equal to or greater than the thickness of layer 142.

Figure 12:
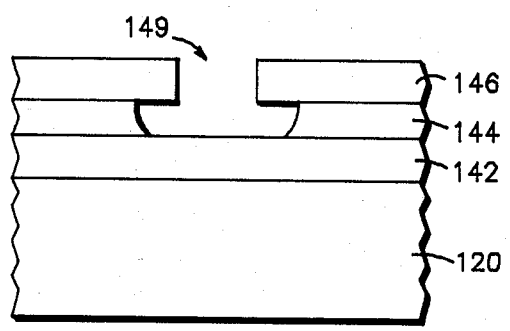

As illustrated in FIG. 12, the positive photoresist is etched (developed) in positive photoresist developer. For example, if the photoresist is AZ1350J, the resist can be developed in a corresponding AZ1350J developer. Overdeveloping of the photoresist image results in etching of the underlying layer of partially cured polyimide. Both the unexposed portion of the photoresist layer 146 and the completely cured layer of polyimide are insoluble in the positive photoresist developer so that neither is etched during the developing of the photoresist layer and the subsequent isotropic etching of partially cured polyimide layer 144.

Figure 13:
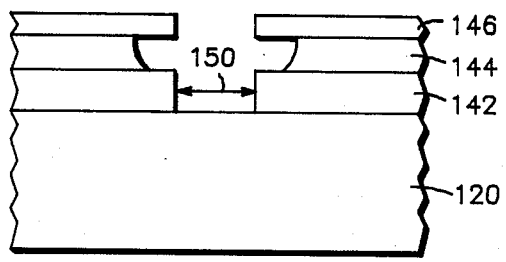

The process is continued, as illustrated in FIG. 13, by anisotropically etching the completely cured layer of polyimide, for example, by reactive ion etching using an oxygen based plasma chemistry. During the reactive ion etching of layer 142, photoresist masking layer 146 acts as a sacrificial etch mask and is etched at approximately the same etch rate as is the completely cured polyimide material. By this etch step the critical dimension 150 is reproduced by the anisotropic reactive ion etching in and through the completely cured polyimide layer 142. A portion of the underlying substrate 120 is thus exposed through an opening having the predetermined critical dimension.

Figure 14:
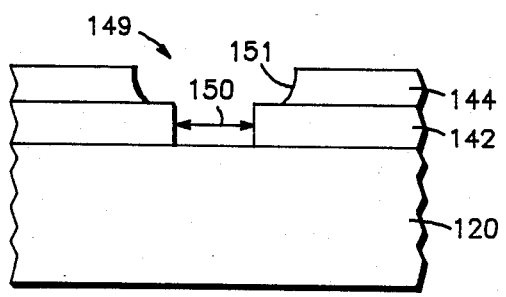

As illustrated in FIG. 14, the process is continued by stripping the remainder of photoresist masking layer 146 in a positive photoresist stripper. The resulting structure includes a semiconductor substrate which is overlaid by first and second polyimide layers 142 and 144, respectively, having an opening formed therethrough to expose a portion of the surface of substrate 120. The opening through the polyimide layers is characterized by a predetermined critical dimension 150 at the base of the opening and by sloped side walls 151.

If the initial thickness of layer 146 is not greater than the thickness of layer 142, layer 146 will be completely stripped during the reactive ion etching of layer 142. The separate step of removing photoresist masking layer 146 is then unnecessary, but only at the expense of some loss in control of the dimensions of the opening etched through layer 142.

The structure as illustrated in FIG. 14 is completed by appropriately heating the structure to completely cure layer 144 to form the structure as illustrated in FIG. 1. Metallization is applied over the polyimide isolated structure to provide desired device contact through openings such as opening 149.

The following is a nonlimiting example which further illustrates preferred embodiments contemplated by the inventor for practice of his invention. The polyimide material used in practicing the invention can be any one of a number of commercially available polyamic acids such as PI 2540, PI 2545, or PI 2555 supplied by E. I. duPont, polyimide siloxine SiPI supplied by General Electric, or PIQ13 supplied by Hitachi. Many polyimide precursors can be used also.

Substrates comprising a silicon wafer having a patterned aluminum metallization on an upper surface were provided. A layer of Hitachi PIQ13 was applied to the substrates. The polyamic acid was applied over the patterned aluminum by spin application at 5000 rpm for 30 seconds to achieve a film having a thickness of about 1 micron. The material was completely cured by heating to 200° C. for 1 hour in air and then to 450° C. for 30 minutes in nitrogen. After the curing, the PIQ13 was completely imidized and was insoluble in positive photoresist developer.

A second layer of PIQ13 was applied as above and was then partially cured by heating to 130° C. for 15 minutes in air.

A masking layer of plasma deposited oxide was deposited over the partially cured polyimide. A layer of AZ1350J positive photoresist supplied by A. Z. Hoechst Corporation was applied over the oxide. The photoresist was prebaked for 30 minutes at 90° C. in air and then pattern exposed to form a pattern of exposed and unexposed resist areas. The resist was developed in a 1:3 mixture of AZ400K developer and water to remove the resist from the exposed photoresist areas.

The oxide was anisotropically etched using the photoresist as a mask. The anisotripic etching was by reactive ion etching using $CHF_3$ and $CO_2$ at a pressure of 65 mtorr and a power of 1100 W. The etch rate was about 50 nm per minute.

The partially cured polyimide was then isotropically etched in the same photoresist developer solution as used above, using the patterned oxide as an etch mask.

The fully cured polyimide was then anisotropically reactive ion etched in oxygen at 10 mtorr and 800 W. The etch rate was about 50 nm per minute.

The remaining photoresist was removed in photoresist stripper and the plasma deposited oxide was removed using a $CF_4/O_2$ plasma.

The partially cured polyimide was then fully cured by heating to 200° C. for 1 hour in air and then to 450° C. for 30 minutes in nitrogen. The resulting structure included a fully cured layer of polyimide having an opening therethrough to expose a portion of the underlying metallization. The opening had sloped sidewalls and a controlled size.

Thus it is apparent that there has been provided, in accordance with the invention, a process for the patterning of polyimide layers and for the fabrication of semiconductor devices which fully meets the objects and advantages set forth above. While the invention has been described and illustrated by reference to certain illustrative embodiments thereof, it is not intended that the invention be limited to these illustrative embodiments. Those skilled in the art, after review of the foregoing description, will realize that certain variations and modifications to those embodiments are possible without departing from the spirit and scope of the invention. For example, the invention has been illustrated by reference to a process for contacting a device region by patterned metallization, but the process of forming openings through a polyimide layer having the characteristics herein achieved is applicable in other device applications. Further, the process can also be continued to provide subsequent polyimide layers and the subsequent etching of openings through those layers. It is intended to include within the invention all such variations and modifications as fall within the scope of the appended claims.

I claim:

1. A method for forming an opening through a polyimide layer to expose an underlying surface wherein said opening is characterized by tapered side walls and a predetermined size, said method comprising the steps of: forming a first layer of cured polyimide on said surface; forming a second layer of partially cured polyimide overlying said first layer; forming a masking layer overlying said second layer; forming a pattern in said masking layer to expose portions of said second layer, said pattern including an opening of predetermined size; isotropically etching said second layer exposed through said pattern to expose portions of said first layer; anisotropically etching said first layer exposed through said second layer using said pattern in said masking layer an etch mask to form an opening of said predetermined size in said first layer; removing said masking layer; and curing said second layer.

2. The method of claim 1 wherein said step of forming a masking layer comprises depositing an inorganic insulator.

3. The method of claim 2 wherein said step of forming a pattern in said masking layer comprises the steps of: forming a resist layer overlying said inorganic insulator; patterning said resist layer; and anisotropically etching said inorganic insulator using said resist layer as an etch mask.

4. The method of claim 3 wherein said step of anisotropically etching said inorganic insulator comprises reactive ion etching.

5. The method of claim 4 wherein said inorganic insulator comprises silicon oxide and said oxide is reactive ion etched in a mixture comprising $CHF_3$ and $CO_2$.

6. The method of claim 1 wherein said step of anisotropically etching said first layer comprises reactive ion etching.

7. The method of claim 6 wherein said rective ion etching comprises etching in oxygen.

8. The method of claim 1 wherein said step of forming a masking layer comprises: applying a layer of positive photoresist.

9. The method of claim 1 wherein said step of isotropically etching comprises etching in positive photoresist developer.

10. A method for forming a semiconductor device comprising the steps of: providing a semiconductor substrate having a surface and having a device region at said surface; forming a first layer of cured polyimide overlying said device region and said surface; forming a second layer of partially cured polyimide overlying said first layer; forming a masking layer overlying said second layer; forming a pattern of openings in said masking layer including an opening of predetermined size overlying and in alignment with said device region; isotropically etching said second layer through said opening using said masking layer as an etch mask; anisotropically etching said first layer using said masking layer as an etch mask to form an opening in said first layer having said predetermined size, said opening in said first layer exposing said device region; curing said second layer of partially cured polyimide; and forming a patterned metallization overlying said second layer and extending into said opening to contact said device region.

11. A method for forming an opening through a polyimide layer to expose an underlying surface which comprises the steps of; applying polyamic acid to said surface and heating to form a first fully cured polyimide layer; applying additional polyamic acid to said cured polyimide layer and heating to form a second partially cured polimide layer overlying said first fully cured polyimide; isotropically etching through said second partially cured polyimide layer; and anisotropically etching through said first fully cured polyimide layer.

* * * * *